(12) United States Patent
Xie et al.

(10) Patent No.: US 7,539,956 B1
(45) Date of Patent: May 26, 2009

(54) SYSTEM AND COMPUTER PROGRAM PRODUCT FOR SIMULTANEOUS CELL IDENTIFICATION/TECHNOLOGY MAPPING

(75) Inventors: Aiguo Xie, Sunnyvale, CA (US); Sumit Roy, San Jose, CA (US)

(73) Assignee: Calypto Design Systems, Inc., Santa Clara, CA (US)

( * ) Notice: Subject to any disclaimer, the term of this patent is extended or adjusted under 35 U.S.C. 154(b) by 200 days.

(21) Appl. No.: 11/601,272

(22) Filed: Nov. 16, 2006

(51) Int. Cl.
*G06F 17/50* (2006.01)

(52) U.S. Cl. .................. 716/3; 716/1; 716/2; 716/4

(58) Field of Classification Search .............. 716/1, 716/2, 3, 4
See application file for complete search history.

(56) References Cited

U.S. PATENT DOCUMENTS 5,913,101 A * 6/1999 Murofushi et al. ............ 438/6
6,401,231 B1   6/2002 Belkhale et al. ............. 716/6

OTHER PUBLICATIONS

Pradip K. Jha, et al. "High—Level Library Mapping for Arithmetic Components", IEEE Trans. on Very Large Scale Integration (VLSI) System, vol. 4, No. 2, Jun. 1996, pp. 157-169.*
Dong-U Lee, et al. "Optimizing Hardwarew Function Evaluation", IEEE Trans. on Computers, vol. 54, No. 12, Dec. 2005, pp. 1520-1531.*
Elke A. Rundensteiner et al. "Component Synthesis from Functional Descriptions", IEEE Trans. on Computer—Aided Design of Integrated Circuits and Systems, vol. 12, No. 9, Sep. 1993, pp. 1287-1299.*
K. Keutzer, "DAGON: Technology Mapping and Local Optimization" *IEEE/ACM Proc. of the Design Automation Conf.*, pp. 341-347, Jun. 1987.
User manual "*Datapath Option of Ambit BuildGates Synthesis and Cadence PKS*" Product version 4.0.8, Cadence, May 2001.
L. Benini and G. D. Micheli, "A Survey of Boolean Matching Techniques for Library Binding" *ACM Trans. on Design Automation of Electronic Systems*, vol. 2, No. 3, pp. 193-226, 1997.
Chaudhary et al. "Computing the Area versus Delay Trade-Off Curves in Technology Mapping" IEEE Trans. on *Computer Aided Design*, vol. 14, No. 12 (1995), pp. 1480-1489.
Garey et al. "Computers and Intractability: A Guide to the Theory of NP-Completeness" W.H. Freeman and Company, New York, 1979.
Cormen et al. *Introduction to Algorithms* ($2^{nd}$ Edition, Chapter 15), The MIT Press, Sep. 2001.

* cited by examiner

*Primary Examiner*—Jack Chiang
*Assistant Examiner*—Magid Y Dimyan
(74) *Attorney, Agent, or Firm*—Zilka-Kotab, PC

(57) ABSTRACT

A system, method and computer program product are provided for simultaneous cell identification/technology mapping. In use, a plurality of data operators is received. Further, at least two cells are identified for each data operator, simultaneously with technology mapping. By this design, at least one of the cells may thus be selected for design optimization purposes.

15 Claims, 6 Drawing Sheets

SYSTEM AND COMPUTER PROGRAM PRODUCT FOR SIMULTANEOUS CELL IDENTIFICATION/TECHNOLOGY MAPPING

BACKGROUND AND FIELD OF THE INVENTION

The present invention relates to design optimization, and more particularly, to optimizing designs in an improved manner.

SUMMARY

A system, method and computer program product are provided for simultaneous cell identification/technology mapping. In use, a plurality of data operators is received. Further, at least two cells are identified for each data operator, simultaneously with technology mapping. By this design, at least one of the cells may thus be selected for design optimization purposes.

DETAILED DESCRIPTION

Figure 1:
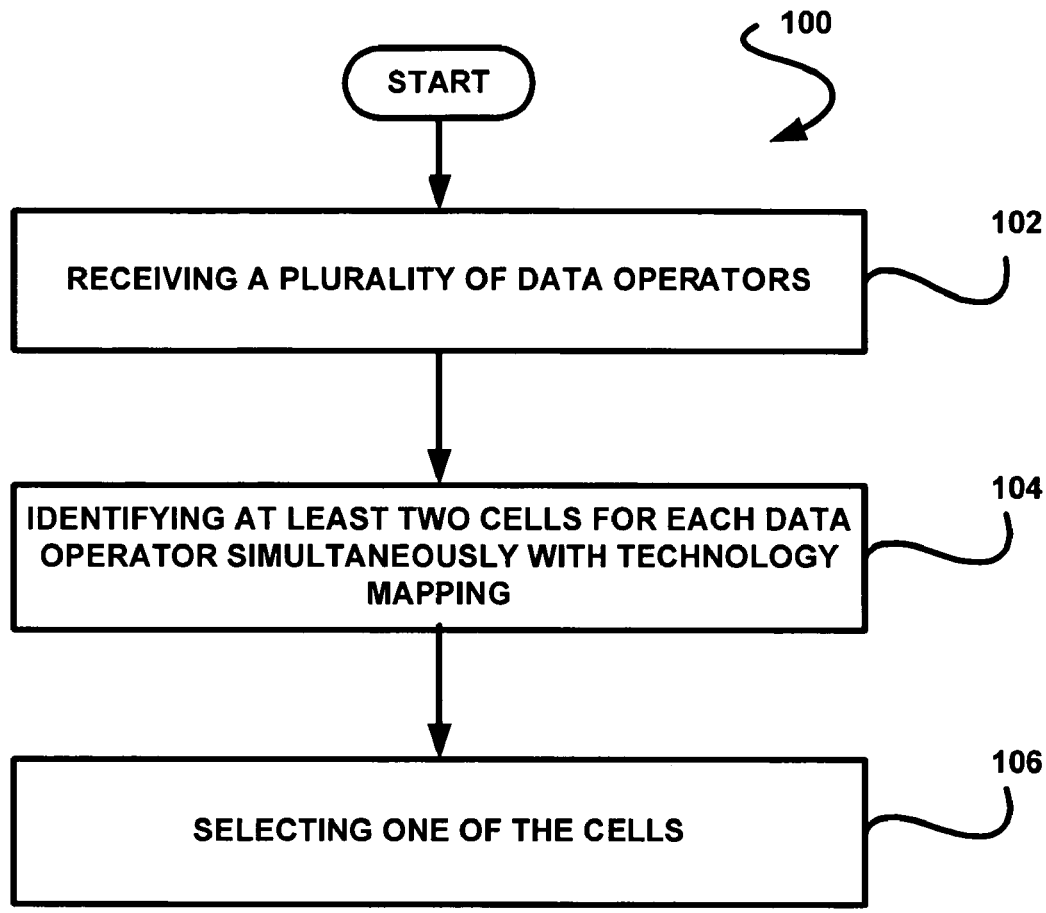
FIG. 1 illustrates a method for simultaneous cell identification/technology mapping, in accordance with one embodiment.

FIG. 1 illustrates a method 100 for simultaneous cell identification/technology mapping, in accordance with one embodiment. As shown, a plurality of data operators is received. Note operation 102. In the context the present description, the data operators may refer to any operation that may be applied to data. In various exemplary embodiments, the data operators may include Boolean operators, arithmetic operators, multiplexer operators, and/or any other operators, for that matter. In one optional embodiment, the data operators may not necessarily be degenerated. For example, the data operators may be associated with a plurality of architectural choices, each of which may be optimal in particular circumstances.

Further, at least two cells are identified for each data operator, simultaneously with technology mapping. See operation 104. In the context of the present description, such cells may refer to any design-related aspect that is associated with a system capable of the data operator(s). Just by way of example, in one exemplary embodiment, the cells may include architectural cells. Further, such architectural cells may be included in a first library. The first library may, in one possible embodiment, also include abstract data operators, logic cells, pre-characterized blocks as macros, etc. Moreover, as an option, the cells may be identified by receiving information associated therewith (e.g. first library, etc.).

Still yet in the context of the present description, the aforementioned technology mapping may refer to any mapping of a first design to a second design. Thus, as an option, the first library may be associated with the first design. In one possible embodiment, the first design may be represented by a first netlist (e.g. a generic/technology-independent netlist, etc.), while the second design may be represented by a second netlist (e.g. a technology-dependent netlist, etc.).

Still yet, at least one of the cells is selected for design optimization purposes. Note operation 106. For example, in the context of the above embodiment involving a first and second design, the aforementioned cell(s) may be selected for the second design such that it is optimized. Thus, in one embodiment, the selection of one of the cells from the above-mentioned first library may result in a second library of cells, etc. that is associated with a second design that is functionally equivalent to the first design. Optionally, the second library may, in one possible embodiment, also include technology logic cells, macros, small data operators, etc.

To this end, the simultaneous cell identification/technology mapping may provide for more efficient design optimization. For example, in one embodiment, the identification of the two cells for each data operator and the technology mapping may be carried out in single step. In addition, the aforementioned technology mapping may optionally be globally optimal.

Just by way of example, it may be determined if timing constraints can be met. Such timing constraints may include, for example, user-defined timing constraints. Moreover, in one optional embodiment, the netlist of the second design may achieve a minimal combination of area and power, if the timing constraints can be met. Further, the netlist of the second design may achieve a minimal worst timing violation, if such timing constraints cannot be met. In this way, the second design may be utilized to minimize any given measure (e.g. objective function, etc.), with respect to a given set of fixed or point constraints, and may further be computationally efficient in a situation where the first design is large.

More illustrative information will now be set forth regarding various optional architectures and features of different embodiments with which the foregoing framework may or may not be implemented, per the desires of the user. It should be strongly noted that the following information is set forth for illustrative purposes and should not be construed as limiting in any manner. Any of the following features may be optionally incorporated with or without the other features described. See Appendix A for various definitions that may be useful in addressing any of the described embodiments.

As described above with respect to FIG. 1, data operators, in one embodiment, may not necessarily be degenerated. In this way, instantiations of the data operators in a particular design may not necessarily be replaced with a unique architecture thereof, where such data operators are subsequently removed from an associated library. In particular, when a first library is free of data operators, a technology mapping challenge may potentially arise.

However, when the first library contains data operators, the challenge may be significantly more complicated because one may also be required to determine an optimal architecture for each data operator instance. Although choosing an optimal architecture for a standalone data operator is itself a technology mapping challenge, the same challenge for a data operator embedded in a larger first design may be substantially more difficult. This is because the optimality of the data operator may depend on that of its surroundings, i.e., the rest of the first design, and vice versa. In various embodiments, such challenge may optionally be addressed, at least in part, by way of the techniques set forth below.

Figure 2:
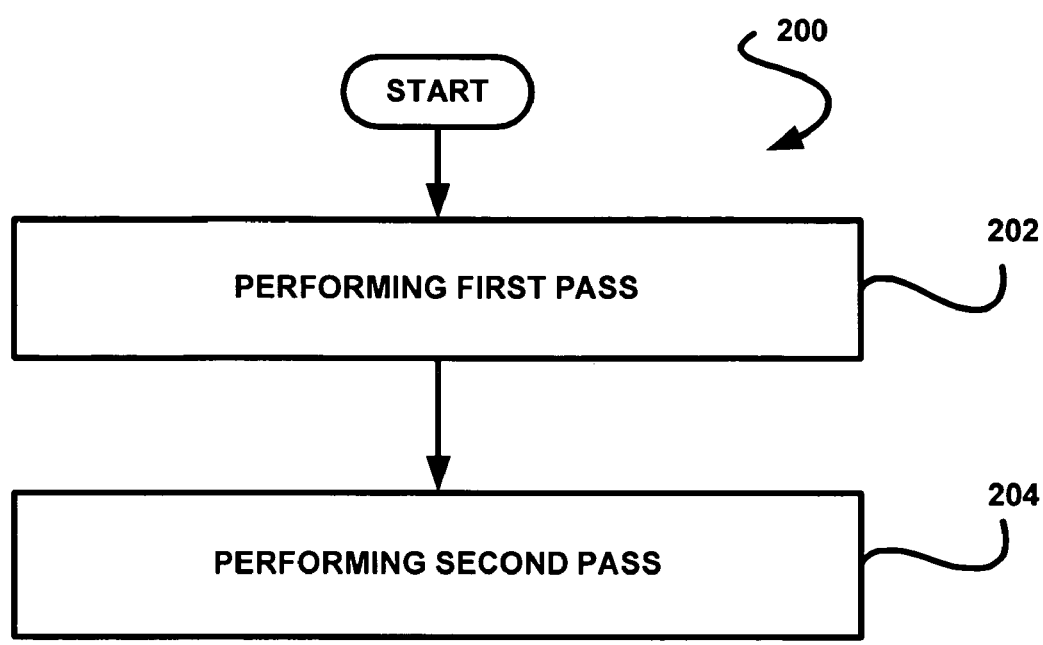
FIG. 2 illustrates a method for simultaneous cell identification/technology mapping carried out in the context of two passes, in accordance with another embodiment.

FIG. 2 illustrates a method 200 for simultaneous cell identification/technology mapping carried out in the context of two passes, in accordance with another embodiment. As an option, the method 200 may be employed in the context of the method 100 of FIG. 1. Further, the foregoing definitions may apply during the course of the present description.

As shown, cell identification/technology mapping may be carried out simultaneously in the context of two passes. Thus, the optimal architectural selection and technology mapping may be solved utilizing a single step. As an option, a refinement phase may be applied to further improve the implementation quality.

As shown in operation 202, a first pass is performed. In the first pass, optimal implementations may be progressively constructed and propagated from the begin ports to the end ports of the first design using dynamic programming. In this way, forward propagation may be utilized in the first pass.

Each internal port may retain a range of optimal implementations which may be the basis to implement other downstream ports. Thus, optimal implementations may be propagated into and out of a data operator without necessarily having to choose a particular architecture for such data operator beforehand. For example, the architectures may be encoded in the optimal implementations as the propagation leaves a particular data operator. Thus, in one embodiment, the first pass may be performed for complete optimization.

In addition, a second pass is performed, as shown in operation 204. In the second pass, the final implementations may be propagated from the end ports to the begin ports based on the optimal implementations computed from the first pass. As a result, backward propagation may be utilized in the second pass.

The final implementations for the end ports may be determined all at once according to user constraints and/or objectives. Accordingly, final implementations may be propagated into a data operator from its outputs. As a result, the data operator may be optimally implemented and the backward propagation may be ready to resume from its inputs. When the first and second passes end at the begin ports, an optimal implementation for a first design is received. In this way, the second pass may be performed for refining such optimal implementation.

It should be noted that, in another optional embodiment, the first pass may start from the end ports and the second pass may start from the begin ports. Table 1 illustrates one example of optimally implementing data operators utilizing two passes. It should be noted that such example is for illustrative purposes only, and should not be construed as limiting in any manner.

TABLE 1

```
//where P1 is the challenge of determining an optimal architecture
   for each data operator instance
//where D1 is the design that contains instances of a given library
   of cells, where such library may include abstract data operators,
   etc.
//where G is a given measure (e.g. objective function)
//where F is a given set of fixed or point constraints
   Procedure Solve_P1 (D1, G, F)
      begin
         Forward_propagate (D1, G);
         Backward_propagate (D1, G, F);
```

TABLE 1-continued

```
         D2 := Optimal covers of D1;
         return D2;
      end
```

Still yet, a sensitivity analysis challenge, which may accompany the technology mapping challenge described above, may arise where a set of interval constraints are specified instead of a set of fixed constraints being specified. In one embodiment, a range of implementations of the first design may each include a unique optimal trade-off among multiple objectives such as power and area. Thus, the gain for one subset of objectives and an associated cost of what is lost for the remaining objectives may be determined. In this way, a "what-if" analysis may enable efficient register-transfer level (RTL) and architectural exploration.

Figure 3:
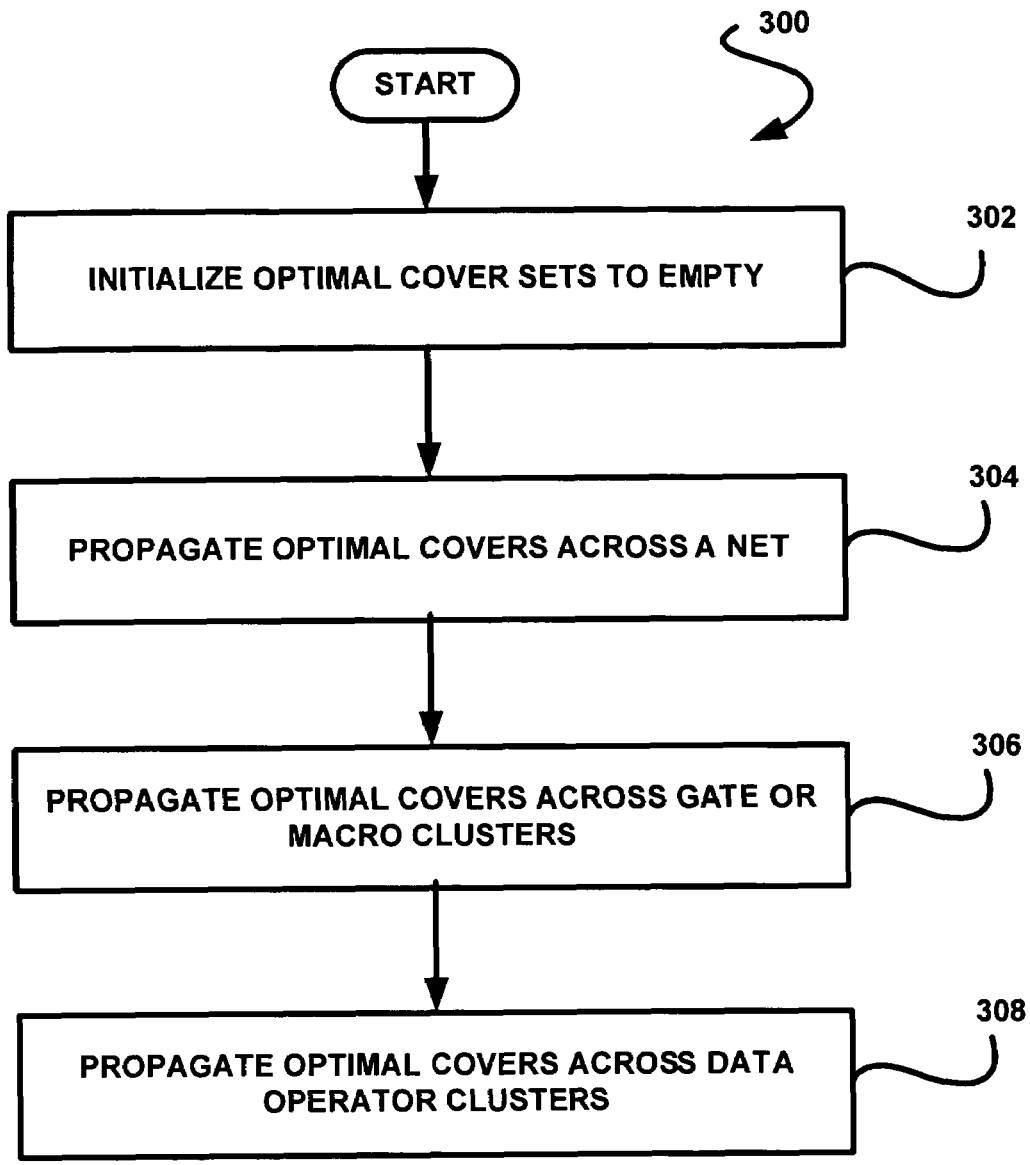
FIG. 3 illustrates a method for performing a first pass in the context of a two-pass simultaneous cell identification/technology mapping technique, in accordance with another embodiment.

FIG. 3 illustrates a method 300 for performing a first pass in the context of a two-pass simultaneous cell identification/technology mapping technique, in accordance with another embodiment. As an option, the method 300 may be employed in the context of the method 200 of FIG. 2, and particularly operation 202 thereof. Further, the foregoing definitions may apply during the course of the present description.

In one embodiment, optimal covers may be determined for all end ports. This may be achieved by progressively propagating optimal covers from the begin ports (i.e. a forward propagation process). To take advantage of both inverting and non-inverting logic gates, two optimal cover sets may be maintained for a port x, C(x, p), where p is either positive or negative. Therefore, C(x, positive) and C(x, negative) may represent covers for x with positive and negative signal polarities, respectively.

As shown in operation 302, optimal cover sets are initialized to empty. Optionally, begin ports which have a unique automatic optimal cover with a zero cost may not be initialized in such a manner. Table 2 illustrates one example of forward propagation for obtaining the optimal covers for the first design (D1). As shown, such forward propagation may be recursive, such that it may invoke itself at another design D1' that is an architecture of a data operator cluster in D1. It should be noted that such example is for illustrative purposes only, and should not be construed as limiting in any manner.

TABLE 2

```
//where D1 is the design that contains instances of a given library
   of cells, where such library may include abstract data operators,
   etc.
//where G is a given measure (e.g. objective function)
   Procedure Forward_propagate (D1, G)
      begin
         // Step 1: Initialize.
         unmark all ports in D1;
         foreach begin port x in D1
         begin
            if x has not be assigned with the optimal cover sets
            begin
               C(x, positive) := {the automatic cover of x};
               C(x, negative) := Empty;
            end
            mark x;
         end
         // Step 2: Compute optimal covers for internal ports of D1.
         foreach end port x in D1
            foreach port y in the fanin cone of x in post-DFS order
            begin
               if y is marked
                  continue;
               if y is a sink port of a net
```

TABLE 2-continued

```
        Forward_propagate_to_net_sink (y, G)
    elsif y is a gate or macro output port
        Forward_propagate_to_gate_output (y, G)
    else
        Forward_propagate_to_data_operator_output (y, G)
    endif
    mark y;
  end
end
```

As shown in operation 304, optimal covers are propagated across a net. Table 3 illustrates one example of propagating optimal covers across a net. Again, it should be noted that such example is for illustrative purposes only, and should not be construed as limiting in any manner.

TABLE 3

```
//where x is a net sink port
    Procedure Forward_propagate_to_net_sink (x, G)
    begin
        foreach source port y driving port x across a net and foreach
signal polarity p'
            foreach cover c in C(y, p') and each possible net implement
h
            begin
                construct a cover c' for x using c and h;
                C(x, p) := C(x, p) + c', where p is the polarity of c' with
respect to x in D1, '+' denotes set union;
            end
        end
```

As shown in Table 3, set C(x, p) may remain optimal (or non-redundant). Such optimization may be achieved by either dropping c' if it is dominated by an existing cover in C(x, p) or dropping any existing covers in C(x, p) it dominates.

Further, as shown in operation 306, optimal covers are propagated across gate or macro clusters. Operation 306 may be similar to the above net sink port described above, except that the cover cost and objective increments may be based on cluster matches instead of net implementations. However, it should be noted that a macro may include another gate in which it may be implemented by only one library cell.

Table 4 illustrates an example of propagating optimal covers across gate or macro clusters. In the example shown, the cover is propagated to a gate output port x. Again, it should be noted that such example is for illustrative purposes only, and should not be construed as limiting in any manner.

TABLE 4

```
Procedure Forward_propagate_gate_output (x, G)
begin
    foreach cluster u rooted at gate that owns port x
        foreach match v that implements u
            foreach output port z of cluster u
            begin
                if u has been evaluated for z
                    continue;
                else
                begin
                    foreach input port y of x related to z
                        C1(z, y, p) := Compute_partial_covers (z, y, v, G), for
both polarities p;
                        foreach polarity p
                            C2(z, p) := Linear_merge (C1(z, y, p, G), y = {all related
input ports of z});
                        foreach polarity p and foreach cover c in C2(z, p)
                            C(z, p) := C(z, p) + c, so that C(z, p) is non-redundant
```

TABLE 4-continued

```
afterward;
            end
        endif
    end
```

As shown in Table 4, the Compute_partial_covers procedure returns both of the positive and negative optimal cover sets for output port z with respect to input port y if only match v is used. The procedure may derive the optimal cover sets based on the previously computed optimal cover sets at input port y and any relevant data of match v. In particular, the cost of match u may be amortized among all of its output ports.

As also shown in Table 4, the Linear_merge procedure returns the optimal cover sets of port z using match v by combining the partial optimal covert sets just computed. For example, each resultant optimal cover may be a full combination of partial covers, one from each partial optimal cover set. The combination may evaluate the constraint and objective functions appropriately. Optionally, the procedure may have a linear time complexity.

Still yet, as shown in operation 308, optimal covers are propagated across data operator clusters. In this way, the architectural selection and technology mapping may be unified. Optimal cover sets may be computed for a source port x of a data operator by pushing forward the optimal cover sets at the input ports of all data operator clusters of which x is an output port. Table 5 illustrates an example of propagating optimal covers across data operator clusters. Again, it should be noted that such example is for illustrative purposes only, and should not be construed as limiting in any manner.

TABLE 5

```
Procedure Forward_propagate_to_data_operator_output (x, G)
    begin
        foreach data cluster u rooted at a data operator node that owns port x
        begin
            A := Generate_architectures (u);
            foreach architecture a in A
            begin
                // Step 1: Push down optimal covers to the candidate
architecture.
                Let D1' be the netlist of a;
                foreach begin port y in D1'
                begin
                    z := input port of cluster u corresponding to port y;
                    C(y, p) := C(z, p), for both polarities p;
                end
                // Step 2: Propagate optimal covers within the candidate
architecture.
                Forward_propagate (D1', G);
                // Step 3: Pull up the optimal covers from the candidate
architecture.
                foreach end port y in D1'
                begin
                    z := output port of cluster u corresponding to port x;
                    ID := an identification of architecture a;
                    C(z, p) := C(z, p) + {C(y, p), ID}, where '+' is the usual non-
redundant set union in G.
                end // foreach end port.
            end // foreach architecture.
        end // foreach cluster.
    end // Procedure.
```

As shown in Table 5, the Generate_architectures procedure may be utilized to abstract the process of a data-path architecture generator, which may work independently of the optimal covers at the input of a data operator cluster. It may be possible to use a more sophisticated architecture generator that respects the optimal covers at the cluster inputs.

For each architecture, a call to the top-level forward propagation procedure may be invoked, resulting in a recursive process. The recursive nature of the approach may allow a data-path architecture itself to contain other abstract data operators, i.e., instances of data operator cells in a first library. As further shown in FIG. 5, each end port optimal cover may be annotated with the architectural identifier (ID) when lifting it up from the lower-level propagation call. As will be described in more detail below, such ID may be used to recover the optimal architecture.

Figure 4:
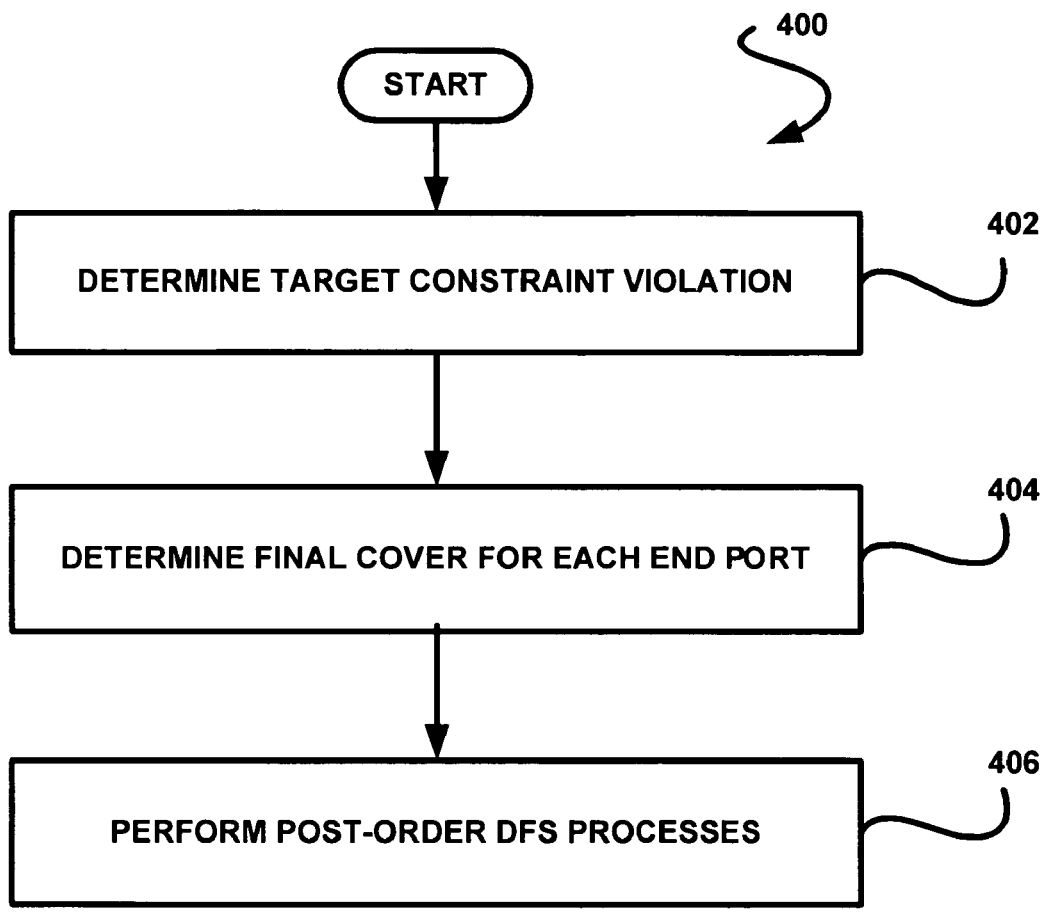
FIG. 4 illustrates a method for performing a second pass in the context of a two-pass simultaneous cell identification/technology mapping technique, in accordance with another embodiment.

FIG. 4 illustrates a method 400 for performing a second pass in the context of a two-pass simultaneous cell identification/technology mapping technique, in accordance with another embodiment. As an option, the method 400 may be employed in the context of the method 200 of FIG. 2, and particularly operation 204 thereof. Further, the foregoing definitions may apply during the course of the present description.

The method 400 may include the Backward_propagate procedure described above in Table 1 of FIG. 2. Thus, globally optimal covers for a first design may be determined based on the intermediate optimal covers computed in the Forward_propagate procedure also described above in Table 1 of FIG. 2.

As shown in operation 402, a target constraint violation is determined. Such target constraint violation may include the global target slack. This may be computed as the minimum of the best possible slacks among all end ports, and truncated down to 0 when in positive excess. The final cover is then determined for each end port, as shown in operation 404. For example, the final cover may be determined according to the target global slack.

Further, as shown in operation 406, post-order Depth-first search (DFS) processes are performed. In one optional embodiment, each of such processes may be performed for each begin port (instead of end port). Each post-order DFS process may determine the final covers for relevant ports in the fanout cone of the begin port. Moreover, such processes may each call three procedures, according to the types of the destination ports, as will be described in more detail below.

Table 6 illustrates an example of such Backward_propagate procedure. As shown, the final optimal covers are determined for all end ports, and then the final optimal covers are propagated back toward the begin ports in a post-DFS order. It should be noted that such example is for illustrative purposes only, and should not be construed as limiting in any manner.

TABLE 6

Procedure Backward_propagate (D1, G, F)
begin
   // Step 1: Compute the global constraint violation target, referred to as global_slack.
    unmark all ports in D1;
    global_slack := Positive infinity;
    foreach end port x of D1
    begin
      local_best_slack := max{ F(c) | all covers c in C(x, positive) };
      global_slack := min (global_slack, local_best_slack);
      mark x;
    end
    global_slack := min (global_slack, 0);
   // Step 2: Compute the final cover for each end port.
    foreach end port x of D1
      final_cover(x) := A cover c in C(x, positive) that minimizes G(c) such that F(c) >= global_slack.
   // Step 3: Compute the final covers for internal ports.
    foreach begin port x of D1
      foreach port y in the fanout cone of x in post-DFS order TABLE 6-continued begin
   if y is marked || y supports no final cover already computed
     continue;
   if y is a source port of a net
     Backward_propagate_to_net_source (y)
   elsif y is a gate or macro input port
     Backward_propagate_to_gate_input (y)
   else
     Backward_propagate_to_data_operator_input (y, G, F, global_slack)
   endif
   mark y;
end
end As shown in Table 6, final covers may be propagated across a net. For example, for each source port y of a net, such propagation may be invoked by the call to procedure Backward_propagate_to_net_source (y), as shown in Table 6 above. Table 7 illustrates an example of such Backward_propagate_to_net_source (y) procedure. Again, it should be noted that such example is for illustrative purposes only, and should not be construed as limiting in any manner.

TABLE 7

Procedure Backward_propagate_to_net_source (y)
begin
   e := net that y connects to;
   candidates := Empty;
   foreach fanout port x in SNK(e);
   begin
     c := final_cover (x);
     candidates := candidates + source_cover (c, y);
   end
   final_cover (y) := cover in candidates that maximizes the local slack at y;
end The procedure source_cover (c, y), as shown in Table 7, may refer to cover c for source port y specified by the final cover of a sink port x. Its polarity may differ from that of other candidates cover for y as specified by the final covers of other sink ports on the net. The procedure may resolve this polarity conflict along with any required implementations by computing the local slack at y for each candidate cover, and then choosing the one with the best local slack. Of course, other similar heuristics for resolving the conflict are possible. Finally, port y may have no final cover if no sink port on the net has a final cover.

As also shown in Table 6, utilizing the call to procedure Backward_propagate_to_gate_input (y) for input port y, final covers may be propagated across a gate cluster to determine the final cover back across a gate. If a gate cluster that y supports has multiple output ports, there may be a conflict between the final covers propagated to its output ports. In such a case, a heuristic similar to the one used when propagating final covers across a net may be utilized to resolve the conflicts. In addition, the procedure may also determine the final covers for all other input ports of the underlying cluster, and then mark them.

Moreover, as shown in Table 6, utilizing a Backward_propagate_to_data_operator_input (y, G, F, global_slack), final covers may be propagated across a data operator cluster. In one embodiment, x may include an output port of a data operator, and may have a final cover c assigned to it. Such propagation may compute the final covers for the input ports of the underlying data operator cluster of the final cover c. Table 8 illustrates an example of propagating final covers across a data operator cluster. Again, it should be noted that such example is for illustrative purposes only, and should not be construed as limiting in any manner.

TABLE 8

Procedure Backward_propagate_to_data_operator_input (y, G, F, global_slack)
begin
    // Step 1: Generate the specific architecture encoded in the final cover.
        c := the final cover for which y is an input port;
        u := corresponding cluster of cover c;
        a := Generate_specific_architecture (u, ID(c));
    // Step 2: Push down optimal covers to the specific architecture.
    Let D1' be the netlist of a;
    foreach begin port x in D1'
    begin
        z := input port of cluster u that corresponds to port x;
        C(x, p) := C(z, p), for both polarities p;
    end
    // Step 3: Compute the optimal implementation of D1' for the given global slack.
    F' := F + global_slack, where '+' denotes appropriate constraint relaxations;
    Solve_P1 (D1', G, F');
    // Step 4: Pull up the final covers from the specific architecture.
    foreach begin port x in D1'
    begin
        z := input port of cluster u corresponding to port x;
        final_cover (z) := final_cover (x);
        mark z;
    end
end As shown in Table 8, the data cluster of the final cover that port y supports may be retrieved, and the corresponding architectural ID may be recovered. The data-path generator may then be called again on the data cluster to request its architecture of the recovered ID. In some optional embodiments, calling the data-path generator on the fly may have better memory efficiency in practice since the generation may be relatively fast.

As further shown in Table 8, a child optimization challenge for the specific architecture may be solved. In particular, the optimal covers previously computed for the input ports of the underlying data operator cluster may be pushed down to the begin ports of the netlist for the architecture. The netlist may then be solved for the given global slack, by calling the procedure Solve_P1, as described above with respect to Table 1 of FIG. 2. Note that this may make the top procedure Solve_P1 recursive. In addition, the final covers of the begin ports of the netlist implementing the data operator cluster may be lifted up to the netlist where y belongs.

Optionally, net load budgets may be utilized to improve robustness. In addition, cache may be utilized for the optimal implementation of a data operator cluster to save run-time. The cache may be looked up based on the evaluated constraints of the input ports of the cluster. Further, optimal cover sets may be bound, for example, using a minimal area implementation and optimistic backward propagation to reduce complexity. Still yet, gates may be resized and architecturally re-selected.

Figure 5:
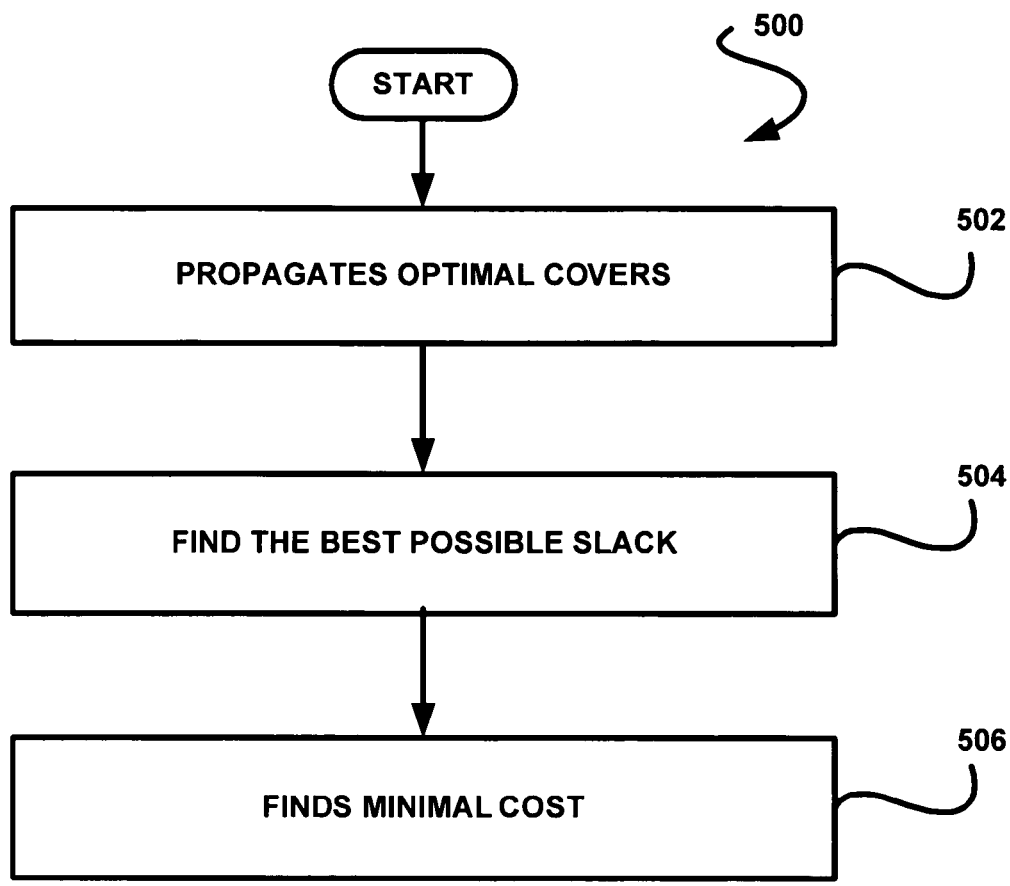
FIG. 5 illustrates a method for analyzing design sensitivity, in accordance with another embodiment.

FIG. 5 illustrates a method 500 for analyzing design sensitivity, in accordance with another embodiment. As an option, the method 500 may be employed in the context of the various functionality of previous figures. Further, the foregoing definitions may apply during the course of the present description.

A global value of sensitivity analysis may be utilized to compute a range of trade-offs when implementing a design instead of obtaining a single optimal implementation. For example, given a design D1 with objective function G and constraints F, a list of trade-offs may be found in pairs of a global slack s and a minimal cost to implement D1 such that the global slack s is achieved.

As shown in operation 502, optimal covers are propagated. For example, such optimal covers may be propagated in a first design by calling a Forward_propagation procedure, such as that described above with respect to Table 1 in FIG. 2. In addition, the best possible slack is found, as shown in operation 504. For example, a Compute_best_slack procedure may be called to find the best possible slack for D1 under user constraints F, which may be similar to the first step in the procedure Backward_propagation to find the global slack, as described above with respect to Table 6 in FIG. 4.

Still yet, in operation 506, all global slacks are stepped through in increments of a delta slack value, and a minimal cost for each of these global slack values is found. To find a minimal cost for a given global slack s, the minimal cost may be added among all covers for each end port that yield a local slack no worse than s. Procedure Compute_trade_off, as described below with respect to Table 9, may abstract the process of finding the minimal cost.

Optionally, optimal covers may be propagated only once, thus providing efficiency. Table 9 illustrates one example of a sensitivity analysis. Again, it should be noted that such example is for illustrative purposes only, and should not be construed as limiting in any manner.

TABLE 9

Figure 6:
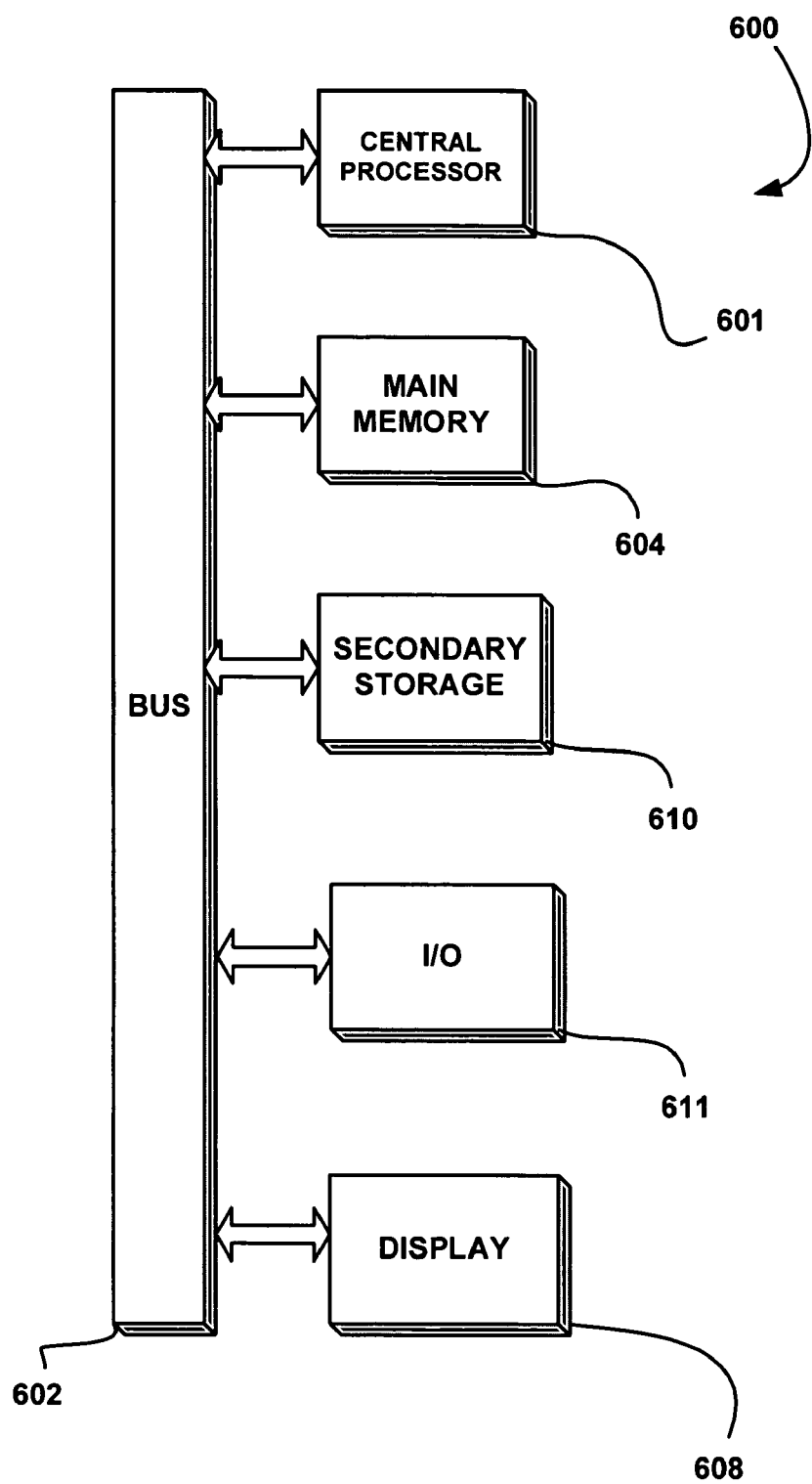
FIG. 6 illustrates an exemplary computer system in which the various architecture and/or functionality of the various previous embodiments may be implemented.

Procedure Solve_P2 (D1, G, F, stopping_slack, delta_slack)
begin
    // Step 1: Compute optimal covers for D1.
    Forward_propagate (D1, G);
    // Step 2: Find best achievable slack for D1.
    best_global_slack := Compute_best_slack (D1, F);
    // Step 3: Collect all trade-offs at the specified slack increments.
    trade_offs := Empty;
    repeat
        (slack, cost) := Compute_trade_off (D1, F, best_global_slack);
        trade_offs := trade_offs + (slack, cost), where '+' appends the list;
        best_global_slack := best_global_slack − delta_slack;
    until best_global_slack > stopping_slack;
    return trade_offs;
end FIG. 6 illustrates an exemplary computer system 600 in which the various architecture and/or functionality of the various previous embodiments may be implemented. As shown, a computer system 600 is provided including at least one host processor 601 which is connected to a communication bus 602. The computer system 600 also includes a main memory 604. Control logic (software) and data are stored in the main memory 604 which may take the form of random access memory (RAM).

The computer system 600 also includes various I/O devices 611 (e.g. keyboard, mouse, camera, microphone, etc.) and a display 608, i.e. a computer monitor. The computer system 600 may also include a secondary storage 610. The secondary storage 610 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 604 and/or the secondary storage 610. Such computer programs, when executed, enable the computer system 600 to perform various functions.

Memory 604, storage 610 and/or any other storage are possible examples of computer-readable media.

In one embodiment, such computer programs may be used to carry out the functionality of the previous figures. Further, in other embodiments, the architecture and/or functionality of the various previous figures may be implemented in the context of the host processor 601, a chipset (i.e. a group of integrated circuits designed to work and sold as a unit for performing related functions, etc.), and/or any other integrated circuit for that matter.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

APPENDIX A

Constraints and objectives: The optimization challenge P1 is to transform design D1 into another design D2 that minimizes objective function G. It may be stated as:

minimize G(D2)

such that $Fi(D2)<=0$, $i=1, \ldots, m$ where G is the objective function, F0, F1, ..., Fm represent a number of constraints, and F and G are convex functions. For example, they may be the worst delay of D2, or power consumption of D2, or area of D2, or some weighted combination of delay, power and area, etc. In the context of the above described embodiments, F may refer to all m constraints collectively.

Netlist: Design D1 may be represented as a netlist. In one optional embodiment, a netlist may include a set of primary input ports PI, a set of primary output ports, PO, a set of nodes N and a set of nets E. A node x in N may be an instance of a cell in a library L1 and may have a number of input ports I(x) and a number of output ports O(x). A net e in E may connect a number of source ports SRC(e) and a number of sink ports SNK(e). Primary input ports and node output ports may include source ports. Similarly, primary output ports and node input ports may include sink ports.

Begin and end ports: A begin port may include either a primary input port or a data output port of a sequential node. A node may be sequential if its operation is active only at or after a clock event. An end port may optionally be either a primary output port or a data input port of a sequential node. The clock input port of a sequential node may be defined as either a begin port or an end port to incorporate a timing relationship between data and clock, depending on the cell type of the sequential node.

Clusters: A cluster may be a connected subset of nodes in N for which a functional equivalent implementation using cells from L1 is known. A data cluster may contain only data operator nodes (or data operators for short). A logic cluster may contain only logic gate nodes (or gates for short). A macro cluster may contain only macro nodes. Given a cluster z, its input port set PI(z) may include all input ports of nodes in z that connect to a source port outside z. Its output port set PO(z) may include all output ports of nodes in z that connect to a sink port outside z (i.e. the IO ports of z). An output of a gate and/or a data operator may have multiple clusters for which it is an output port.

Matches: Given a cluster, a functional equivalent implementation may be called using a library cells match. A match specifies (1) a netlist z1 of cells in L1 and (2) a mapping between the IO ports of the cluster z and netlist z1, i.e., between PI(z1) and PI(z), and PO(z1) and PO(z). For a logic cluster, Boolean matching can be used to find all possible matches. For a macro cluster, a string comparison between cell names and/or instance names may be utilized to find possible matches. For a data cluster, a special data-path generator may be used to obtain multiple functional equivalent netlists including cells in L1. Each of the netlists represents an optimal architecture depending on where and how the data cluster is embedded in D1.

For any port p in D1, it may be matchable if it is an output port of some cluster for which all its input ports connect to source ports that are all matchable. All primary input ports of D1 may be automatically matchable. A cluster in D1 is matchable if (1) it has a match and (2) all of its input ports connect to matchable source ports in D1. Optionally, only matchable clusters may be considered.

Covers: A cover for an output port x of a node may specify (1) a match of a cluster for which x is an output port and (2) a cover for each of the input ports of that cluster. A cover for a primary input port may be automatic. A cover for a sink port x of a node may specify (1) a cover for each of the source ports it connects to on a net and (2) how it should be connected with each of the source ports of the net (e.g., via a wire, a tree of inverters and buffers, etc.). Covers defined as such may be recursive in nature.

The cost of a cover for a primary input port may be 0. The cost of a cover for a sink port may be the sum of the amortized costs of the source ports on the net it connects to and the cost to implement the net. The amortization of a cost over a net may include evenly distributing the cost to all the sink ports of the net. The cost of an output port of a node may include the amortized cost of the match implementing the node plus the cover costs of the input ports of the node. Thus, the amortization of the match may include evenly distributing the cost among all the output ports of the node. We use cost(x) to denote the cost of cover x. The cost may be a convex function of area, power and/or physical implementability. Cost may also include the user objective G.

Given two covers x and y for a port, x dominates y if $G(x)<G(y)$ and $F(x)<=F(y)$, where G and F are the objective and constraint functions. A cover may be optimal if no other cover for the same port dominates it.

What is claimed is:

1. A computer program product embodied on a computer readable medium, comprising:
   computer code for receiving a first design with a first library associated therewith, the first library having a plurality of data operators including non-Boolean data operators and Boolean data operators;
   computer code for identifying at least two cells for each of the plurality of the data operators simultaneously with technology mapping; and
   computer code for selecting one of the cells for a second design, the second design being functionally equivalent to the first design and associated with a second library.

2. The computer program product of claim 1, wherein the identifying and the technology mapping are carried out in the context of two passes, where the first pass utilizes forward propagation and the second pass utilizes backward propagation.

3. The computer program product of claim 1, wherein the data operators include arithmetic operators.

4. The computer program product of claim 1, wherein the data operators include multiplexer operators.

5. The computer program product of claim 1, wherein the cells include architectural cells.

6. The computer program product of claim 1, wherein the at least two cells are included in the first library.

7. The computer program product of claim 1, wherein the first design has a netlist associated therewith.

8. The computer program product of claim 1, wherein the selection of one of the cells results in the second library associated with the second design.

9. The computer program product of claim 8, wherein the second design has a netlist associated therewith.

10. The computer program product of claim 9, and further comprising determining if timing constraints can be met.

11. The computer program product of claim 10, wherein the timing constraints are user-defined.

12. The computer program product of claim 10, wherein the netlist of the second design achieves a minimal combination of area and power, if the timing constraints can be met.

13. The computer program product of claim 10, wherein the netlist of the second design achieves a minimal worst timing violation, if the timing constraints cannot be met.

14. The computer program product of claim 1, wherein the identification of the two cells for each of the plurality of the data operators and the technology mapping are carried out in single step.

15. A system, comprising:
   logic for receiving a first design with a first library associated therewith, the first library having a plurality of data operators including non-Boolean data operators and Boolean data operators;
   logic for identifying at least two cells for each of the plurality of the data operators simultaneously with technology mapping; and
   logic for selecting one of the cells for a second design, the second design being functionally equivalent to the first design and associated with a second library.

* * * * *